US007041230B2

(12) United States Patent
Su et al.

(10) Patent No.: US 7,041,230 B2
(45) Date of Patent: May 9, 2006

(54) METHOD FOR SELECTIVELY ETCHING ORGANOSILICATE GLASS WITH RESPECT TO A DOPED SILICON CARBIDE

(75) Inventors: Xingcai Su, Fremont, CA (US); Bi Ming Yen, Fremont, CA (US); Peter Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 173 days.

(21) Appl. No.: 10/348,724

(22) Filed: Jan. 21, 2003

(65) Prior Publication Data

US 2004/0140289 A1 Jul. 22, 2004

(51) Int. Cl.
*H01L 21/00* (2006.01)

(52) U.S. Cl. .............................. 216/80; 216/41; 216/58; 438/691; 438/706; 438/740

(58) Field of Classification Search .................. 216/58, 216/80, 41; 438/691, 706, 740
See application file for complete search history.

(56) References Cited

U.S. PATENT DOCUMENTS

| 5,338,399 | A | 8/1994 | Yanagida | 156/662 |
|---|---|---|---|---|
| 5,366,590 | A | 11/1994 | Kadomura | 156/662 |
| 6,174,451 | B1 | 1/2001 | Hung et al. | 216/67 |
| 6,326,307 | B1 | 12/2001 | Lindley et al. | 438/689 |
| 6,362,109 | B1 | 3/2002 | Kim et al. | 438/706 |
| 6,410,426 | B1 * | 6/2002 | Xing et al. | 438/638 |
| 6,451,703 | B1 | 9/2002 | Liu et al. | 438/710 |
| 6,489,248 | B1 * | 12/2002 | Zhang et al. | 438/714 |
| 6,759,327 | B1 * | 7/2004 | Xia et al. | 438/643 |
| 6,828,250 | B1 * | 12/2004 | Annapragada et al. | 438/723 |
| 2003/0003765 | A1 * | 1/2003 | Gibson et al. | 438/760 |
| 2003/0224595 | A1 * | 12/2003 | Smith et al. | 438/637 |
| 2004/0157453 | A1 * | 8/2004 | Delgadino et al. | 438/691 |

FOREIGN PATENT DOCUMENTS

WO    01/68939 A2    9/2001

OTHER PUBLICATIONS

U.S. Appl. No. 10/215,757, filed Aug. 9, 2002.

* cited by examiner

*Primary Examiner*—Shamim Ahmed
(74) *Attorney, Agent, or Firm*—Beyer Weaver & Thomas, LLP

(57) ABSTRACT

A semiconductor chip formed on a substrate is provided. An oxygen-doped silicon carbide etch stop layer is formed over the substrate. An organosilicate glass layer is formed over the oxygen-doped silicon carbide etch stop layer. A feature is selectively etched in the organosilicate glass layer using an etch with an organosilicate glass to oxygen-doped silicon carbide selectivity greater than 5:1.

9 Claims, 6 Drawing Sheets

METHOD FOR SELECTIVELY ETCHING ORGANOSILICATE GLASS WITH RESPECT TO A DOPED SILICON CARBIDE

BACKGROUND OF THE INVENTION

1. Field of the Invention

The invention relates to a method of and resulting semiconductor formed by selectively etching an organosilicate glass.

2. Description of the Related Art

Integrated circuits and other semi-conductor based devices often include dielectric layers, which have typically been formed from silicon dioxide, $SiO_2$, to insulate conductive lines on various layers of a semiconductor structure.

To facilitate understanding, FIG. 1A is a schematic cut away view of a substrate 104. A dielectric layer 105, such as silicon oxide $SiO_2$, with metal contacts 106 is placed over the substrate 104. An etch stop layer 108, such as silicon nitride, is place over the dielectric layer 105 and metal contacts 106. A second $SiO_2$ dielectric layer 110 is placed over the etch stop layer 108. A via pattern photoresist mask 112 is placed over the second dielectric layer 110. Vias 114, 116 may be etched into the second dielectric layer 110 according to the pattern of the photoresist mask. It is desirable that all of the vias be etched to the etch stop layer 108, but not through the etch stop layer. Due to various factors such as via size and via location, vias may have different etch rates. In this example, the second via 116 has etched completely through the etch stop layer 108 before the first via 114 is completed. In this example, there is not sufficient selectivity between the dielectric 110 and the stop etch layer 108. In addition, there is not sufficient selectivity between the dielectric 110 and the etch mask 112, so that part of the etch mask is etched through causing a slight etch 120. In addition, in this example, the first via 114 has an undesirable uneven etch front, instead of a flat profile.

The via pattern photoresist mask may then be removed and replaced with a trench pattern photoresist mask 124, as shown in FIG. 1B. A first trench 128 and a second trench 130 are etched through the trench pattern photoresist 124. Since a metal contact 106 is exposed through the second via 116, the etching of the trenches may cause the metal contact 106 to have some corrosion 134.

The trench pattern photoresist may then be removed. An etch stop etch may be used to remove the etch stop layer in the vias, as shown in FIG. 1C. Such an etch stop etch would preferably be selective to etch the etch stop with respect to the dielectric. The trenches and vias may then be filled with metal, which is polished down to form dual damascene structures 136.

To make semiconductor circuits faster they are made more compact with increased operating frequencies, where the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant, k, of the material used to form the dielectric layers. As noted above, the dielectric layers in conventional integrated circuits have traditionally been formed of $SiO_2$, which has a dielectric constant of about 4.2. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits and other semiconductor based devices. To date, a number of promising materials, which are sometimes referred to as "low-k materials", have been developed. Many of these new dielectrics are organic compounds. For the purposes of this specification, "low-k" will be considered to mean a dielectric constant of lower than about 4.0.

One promising class of organic low-k materials is organosilicate glasses (OSG). By way of example, but not limitation, such organosilicate dielectrics include CORAL™ from Novellus Systems, Inc. of San Jose, Calif.; Black Diamond™ from Applied Materials of Santa Clara, Calif.; AURORA™ from ASM International N.V. and Sumika Film® (spin-on-glass) available from Sumitomo Chemical America, Inc., Santa Clara, Calif.

During semiconductor wafer processing, features of the semiconductor device have been defined in the wafer using well-known patterning and etching processes. In these processes a photoresist material may be deposited on the wafer and may then be exposed to light filtered by a reticle. The reticle may be a glass plate that is patterned with exemplary feature geometries that block light from propagating through the reticle.

The development of an effective etching process for an organosilicate glass low-k film such as CORAL™ often takes into account several criteria including etch rate, profile control, selectivity to underlying materials as well as critical dimension (CD) control. The etching of low-k dielectric materials has been approached as if a silicon-based dielectric were being etched. This has not proven particularly effective, as with organic low-k films the chemistries and processes needed to effectively etch the material are substantially different than those for traditional silicon oxide etching.

SUMMARY OF THE INVENTION

To achieve the foregoing and in accordance with the purpose of the present invention, a method of forming features over a substrate is provided. An oxygen-doped silicon carbide (SiC:H) etch stop film is formed over the substrate. An organosilicate glass layer is formed over the oxygen-doped silicon carbide etch stop. A feature is selectively etched in the organosilicate glass layer using an etch with a selectivity of an organosilicate glass to the oxygen-doped silicon carbide greater than 5:1.

In another embodiment of the invention semiconductor chip formed on a substrate is provided. An oxygen-doped silicon carbide etch stop is formed over the substrate. An organosilicate glass layer is formed over the oxygen-doped silicon carbide etch stop. A feature is selectively etched in the organosilicate glass layer using an etch with an organosilicate glass to oxygen-doped silicon carbide selectivity greater than 5:1.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

To provide a total lower capacitance it would be desirable that both the dielectric and etch stop layer have a low k-value, since a combination of both the capacitance of the dielectric and etch stop determine the total (or effective) capacitance. An oxygen-doped carbide (SiC) layer has been found to have a low-k value and therefore would make it desirable etch stop film. For example, it may be possible to provide a CVD silicon carbide (SiC:H) doped with oxygen with a dielectric constant of less than 4.2, whereas undoped CVD carbide (SiC:H) may have a dielectric constant above 4.5. Certain processes such as providing a porous doped silicon carbide could provide a layer with even a lower k value. Preferably the oxygen doped silicon carbide is deposited using CVD (Chemical Vapor Deposition).

One problem that has been found with using an OSG dielectric layer with a oxygen doped carbide etch stop is that many etching chemistries for OSG has a selectivity between OSG and doped carbide is less than 3:1.

Silicon nitride, which has a k value above 7.0, has been used as an etch stop for dielectric materials, such as $SiO_2$ and Fluoro-Silicate Glass (FSG). Various etch processes may be used to selectively etch dielectric materials with respect to silicon nitride. When some of these process are used on OSG with an oxygen-doped CVD silicon carbide etch stop the etch selectivity has been found to be insufficient. Similarly, processes to selectively etch OSG with respect to CVD silicon carbide have also been found to be inadequate to selectively etch OSG with respect to oxygen-doped CVD silicon carbide. This may be due to the closer similarity of OSG and oxygen-doped CVD silicon carbide. U.S. Pat. No. 6,362,109, issued Mar. 26, 2002, to Kim et al. discusses selectively etching organosilicate glass with respect to a photoresist and silicon carbide, but does not discuss doped silicon carbides.

In addition, to provide smaller feature sizes, softer photoresist materials are used. These softer photoresist materials are more easily etched.

Figure 1A:
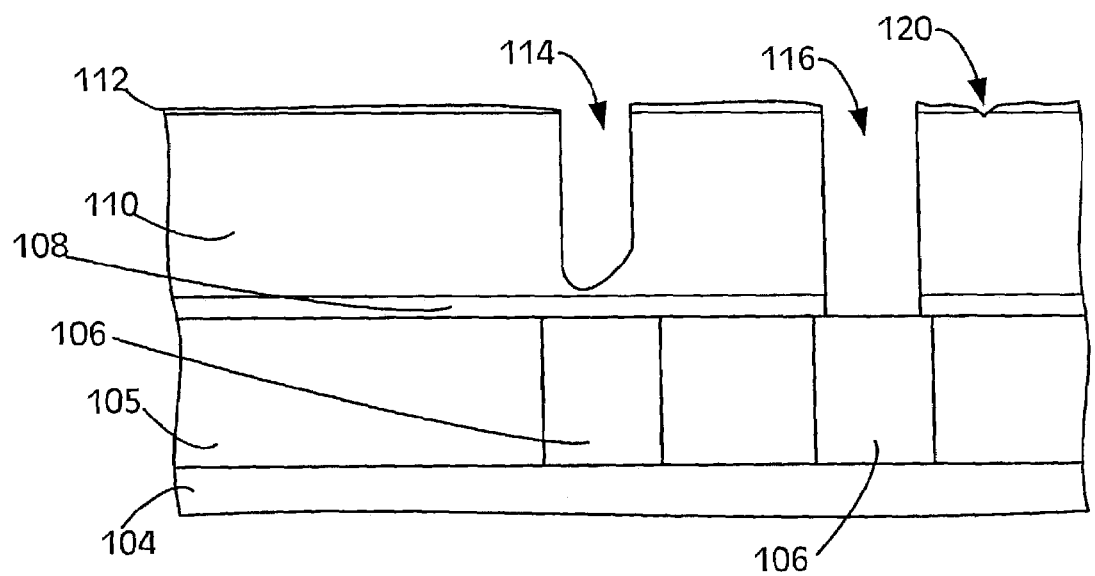
FIGS. 1A–C are schematic views of the formation of features through a prior art process.
Figure 1B:
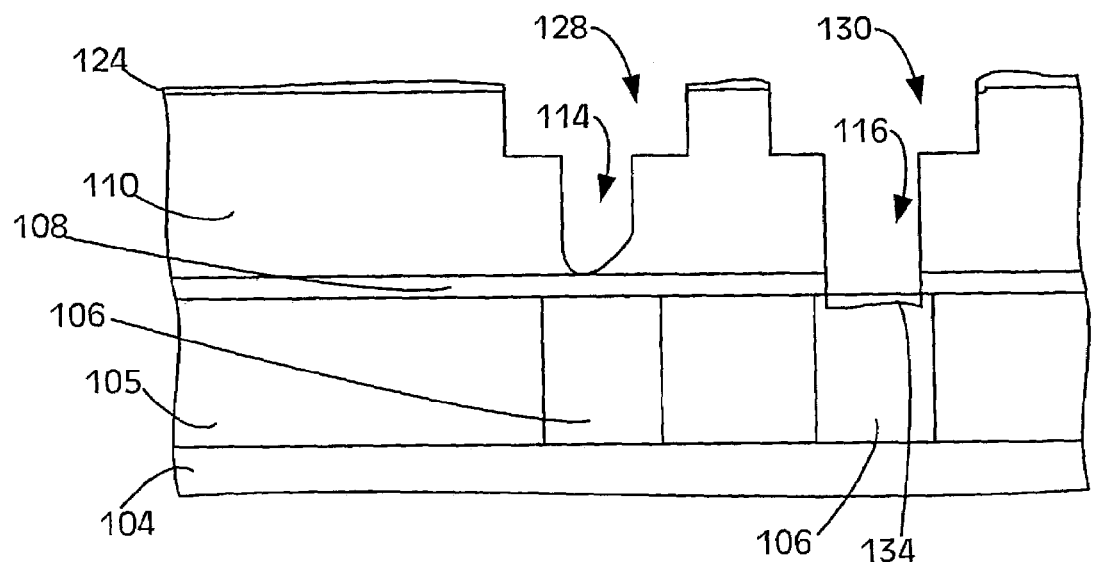
Figure 1C:
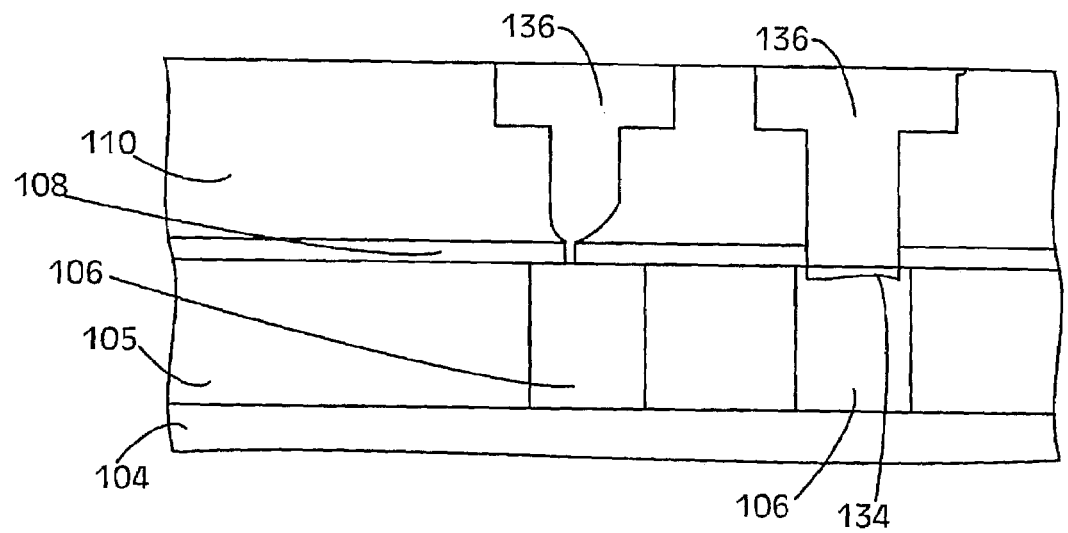
Figure 3:
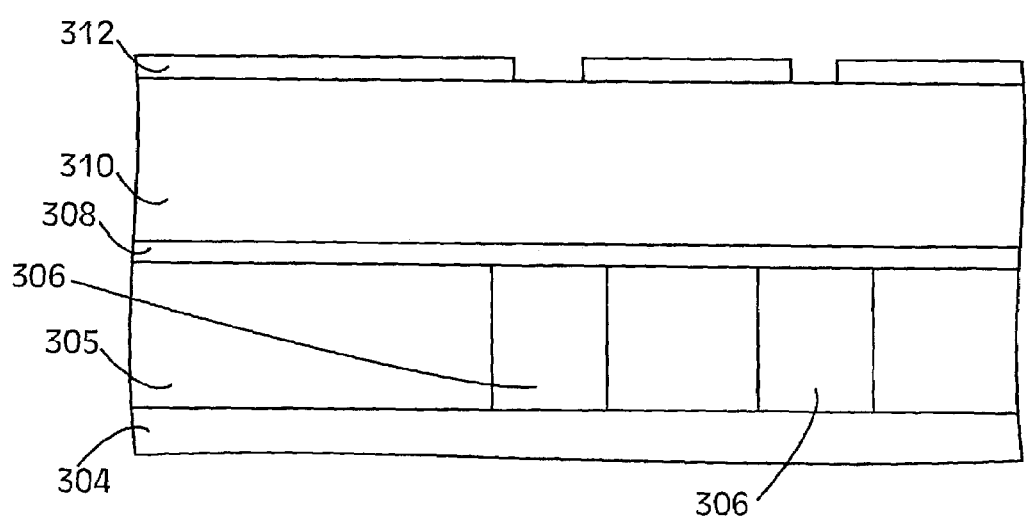
FIG. 3 is a schematic cut away view of a substrate over which a doped carbide layer is provided.
Figure 2:
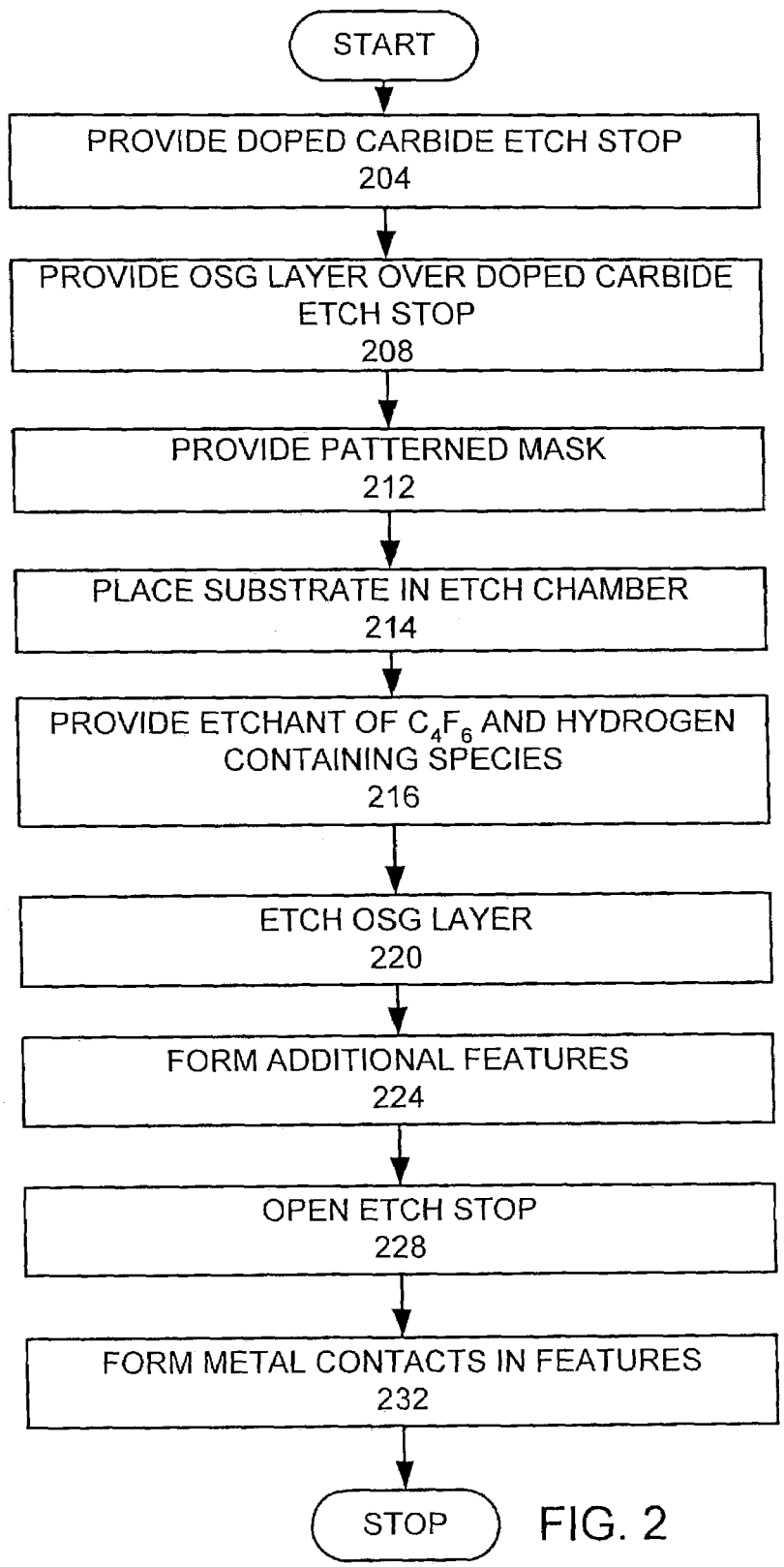
FIG. 2 is a flow chart of a process used in a preferred embodiment of the invention.

FIG. 2 is a flow chart of a process used in a preferred embodiment of the invention. A doped CVD carbide etch stop layer is provided (step 204). FIG. 3 is a schematic cut away view of a substrate 304 over which a doped carbide layer 308 is provided (step 204). In this example, a first dielectric layer 305 with metal contacts 306 are placed between the substrate 304 and the doped carbide layer 308. In other embodiments, any number of layers may be placed between the substrate 304 and doped carbide etch stop layer 308.

In the preferred embodiment, the doped CVD carbide etch stop is formed from silicon carbide doped with high concentration of oxygen. One example of a silicon carbide doped with oxygen has a silicon to carbon to hydrogen to oxygen ratio of about 24:28:30:18. Therefore the ratio of oxygen to silicon is greater than 1:2. In such oxygen doped silicon carbide (oxygen doped carbide (ODC)), most of the hydrogen is bound to silicon. Although CVD carbide may have some oxygen, the percentage of oxygen in the silicon carbide is generally less than few percent. As discussed above, such CVD silicon carbide may have a dielectric constant of about 4.5. Preferably the doped silicon carbide layer has a k value (dielectric constant) of less than 4.2. More preferably, the doped silicon carbide layer has a k value of less than 4.0 (4.0~3.5).

An OSG layer 310 is provided over the dope carbide etch stop layer 308 (step 208). One example of an OSG material has a silicon to carbon to hydrogen to oxygen ration of 20:12:30:38. In this example much of the hydrogen forms $CH_3$ groups, so that most of the hydrogen is bound to carbon. The OSG layer has a k value of less than 4.0. Preferably the OSG layer has a k value of less than 3.0 (3.0~2.2).

A patterned photoresist mask 312 is formed over the OSG layer 310 (step 212). In this example the pattern photoresist mask 312 provides a via pattern. To provide desirable critical dimensions and feature sizes, it is preferred that the photoresist material of the pattern photoresist mask 312 is a photoresist material that is exposed by a radiation of a wavelength that is short than 248 nm. More preferably, the photoresist material is exposed by a radiation of a wavelength that is at most 193 nm. Exposed by radiation of a wavelength that is at most 193 nm means that during the photolithography the photoresist layer is exposed to a radiation of a wavelength that is at most 193 nm, where the radiation of a wavelength that is at most 193 nm allows a transfer of a mask pattern to the photoresist layer so that the photoresist may be developed. Photoresist that is exposed by 193 nm radiation is known as 193 nm generation photoresist.

Figure 4:
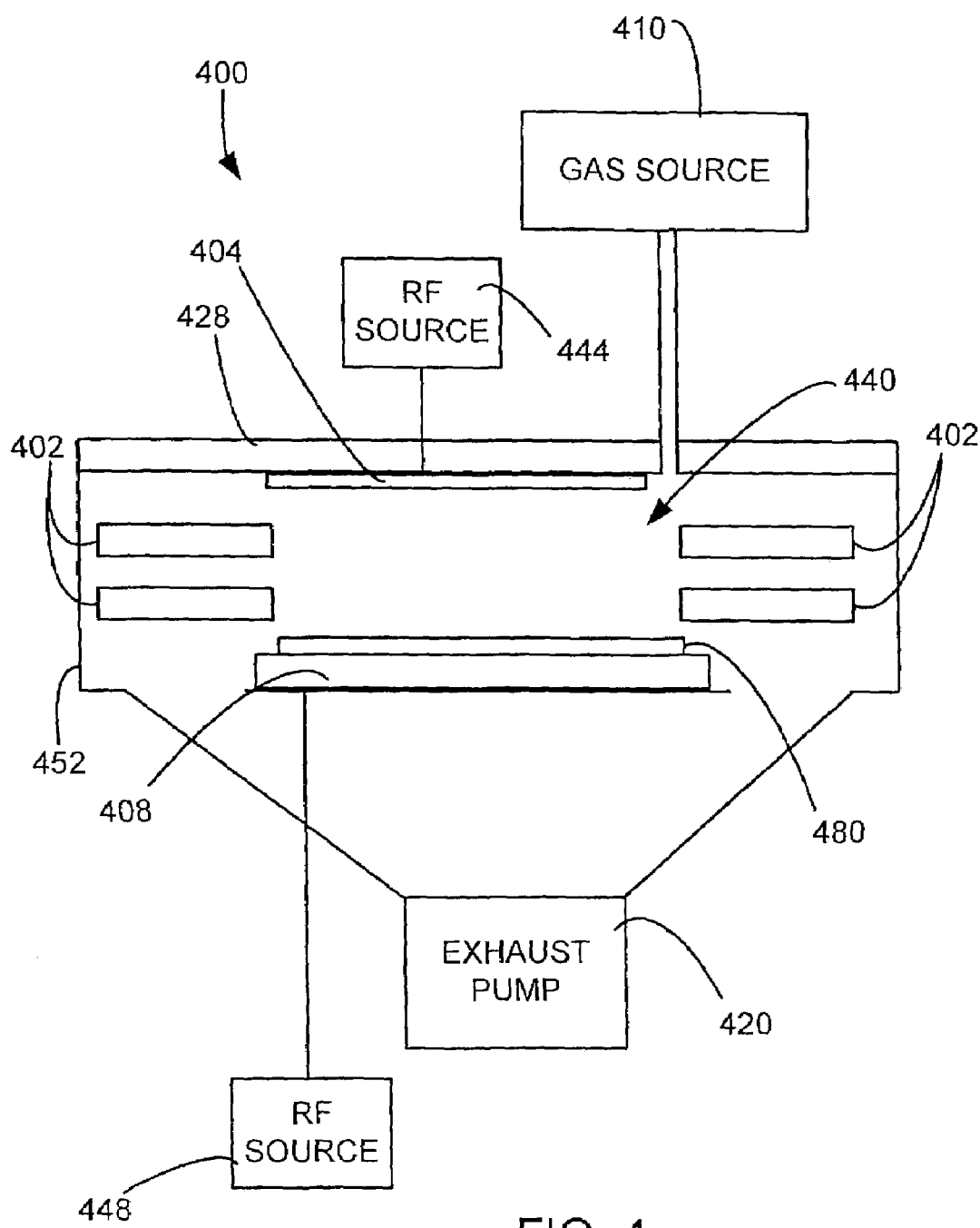
FIG. 4 is a schematic view of a plasma processing chamber.

The substrate 304 is then placed in an etch chamber (step 214). FIG. 4 is a schematic view of a plasma processing chamber 400 that may be used for etching and stripping in an embodiment of the invention. The plasma processing chamber 400 comprises confinement rings 402, an upper electrode 404, a lower electrode 408, a gas source 410, and an exhaust pump 420. Within plasma processing chamber 400, a wafer 480, which is formed from the substrate 304 or on which the substrate is formed, is positioned upon the lower electrode 408. The lower electrode 408 incorporates a suitable substrate chucking mechanism (e.g., electrostatic, mechanical clamping, or the like) for holding the wafer 480. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Exelan HP/2300DFC made by LAM Research Corporation™ of Fremont, Calif., that may be used in a preferred embodiment of the invention, both the RF sources are connected to the lower electrode, and the upper electrode is grounded.

Other embodiments may use other types of processing chambers for providing the etching. In other embodiments, a single processing chamber may be used for applying the etch stop, OSG layer, and mask, in addition to etching.

An etchant gas of $C_4F_6$ and a hydrogen containing species is provided from the gas source 410 to the interior of the etch chamber 400. Preferably, the etching gas comprises $C_4F_6$ and a hydrogen containing species with an additive of $N_2$ or $O_2$. Preferably the hydrogen containing species has more hydrogen than any other element. Preferably, the hydrogen containing species is selected from the group of $CH_3F$, $CH_4$ and $H_2$. Most preferably, the hydrogen containing species is $CH_3F$.

Figure 5:
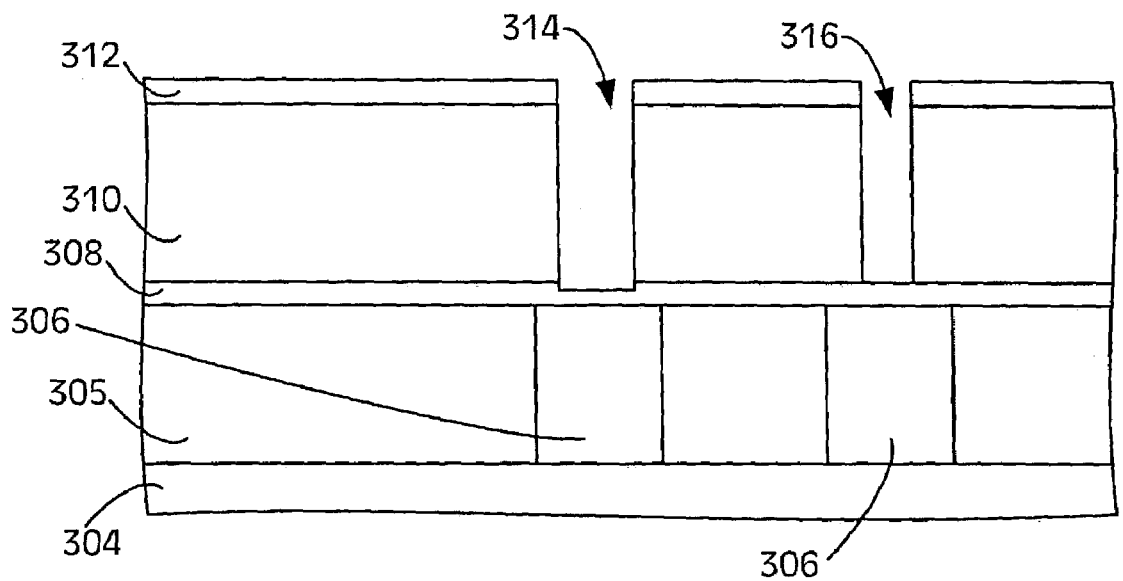
FIG. 5 is a schematic cut away view of a substrate after vias have been etched.

The OSG layer is then etched using the etchant gas (step 220). During this step, a plasma is formed from the etchant gas of $C_4F_6$ and a hydrogen containing species. The plasma is used to etch the OSG layer 304. In a preferred embodiment the parameters used for the etch are 80 mTorr, 600 sccm Ar, 60 sccm $N_2$, 12 sccm $C_4F_6$ and 8 sccm $CH_3F$ with total RF power of 3.5 Kilowatts. Preferred pressure range is 50 mTorr to 120 mTorr. A preferred $N_2$:$C_4F_6$ ratio is 10:1. And a more preferred ratio is 5:1. A preferred ratio of $C_4F_6$:H is between 1:4 to 1:1 and a more preferred ratio is 1:2. FIG. 5 is a schematic view of the resulting structure with features formed from the etching. In this example, the features are a first via 314 and a second via 316.

The inventive etch chemistry, which uses $C_4F_6$, $N_2$, and $CH_3F$, has been found to be able to etch the OSG layer at a rate greater than 800 nm/min. This etch chemistry has been found to have an OSG to doped silicon carbide selectivity may be as high as 15:1, while selectivity for other types of silicon carbide may be less than 5:1. The high selectivity for doped silicon carbide may be caused by selective deposition of polymer on the doped silicon carbide, which causes an etch stop on the etch stop layer after an initial few tens of nanometer loss. Preferable, the etch selectivity between the OSG and the doped silicon carbide etch stop is greater than 5:1. More preferably, the etch selectivity between the OSG and the doped silicon carbide is greater than 10:1. Most preferably, the etch selectivity between the OSG and doped silicon carbide is greater than 15:1. In addition, the plasma may selectively deposit on the photoresist to form a protective layer that is continuously deposited and etched away from the photoresist layer, which protects the photoresist layer. Since the photoresist layer is protected providing high etch selectivity between the OSG and photoresist the thickness of the photoresist may be minimized to provide improved feature critical dimensions. Preferable, the etch selectivity between the OSG and the photoresist is greater than 5:1. More preferably, the etch selectivity between the OSG and the photoresist is greater than 10:1. More preferably, the photoresist loss during an etch is less than 100 nm.

As seen in FIG. 5, the preferred embodiment of the invention protects the photoresist layer 312, so that the photoresist layer remains relatively intact at the end of the etch process. In addition, both the first and second vias 314, 316 are completely etched to the doped silicon carbide etch stop layer 308, without etching completely through the etch stop layer 308. It has been found that the inventive etch chemistry, which uses $C_4F_6$, $N_2$, and $CH_3F$, produces a relatively flat etch front instead of a tapered etch front. In addition, due to the high selectivity between OSG and the doped carbide etch stop layer, even if the first via 314 etches faster than the second via 316 through the OSG layer 310, the second via 316 may be completely etched through the OSG layer 310, before the first via 314 etches through the etch stop layer 308. Due to the high selectivity between the OSG layer and the etch stop layer, the etch stop layer 308 thickness may be minimized. Reducing the thickness of the etch stop layer 308, reduces the influence of the dielectric constant of the etch stop on the total or effective dielectric constant of the combined etch stop layer 308 and OSG layer 310. The inventive etch allows an etch stop with a thickness of less than 50 nm. More preferably, the etch stop has a thickness of less than 40 nm. Most preferably, the etch stop has a thickness of less than 30 nm. Since the etch stop layer has not been completely etched through, the etch stop layer may protect the metal contacts 306 from corrosion and sputtering during subsequent processing. The fast etch rate of the OSG layer 310 provides faster throughput.

Figure 6:
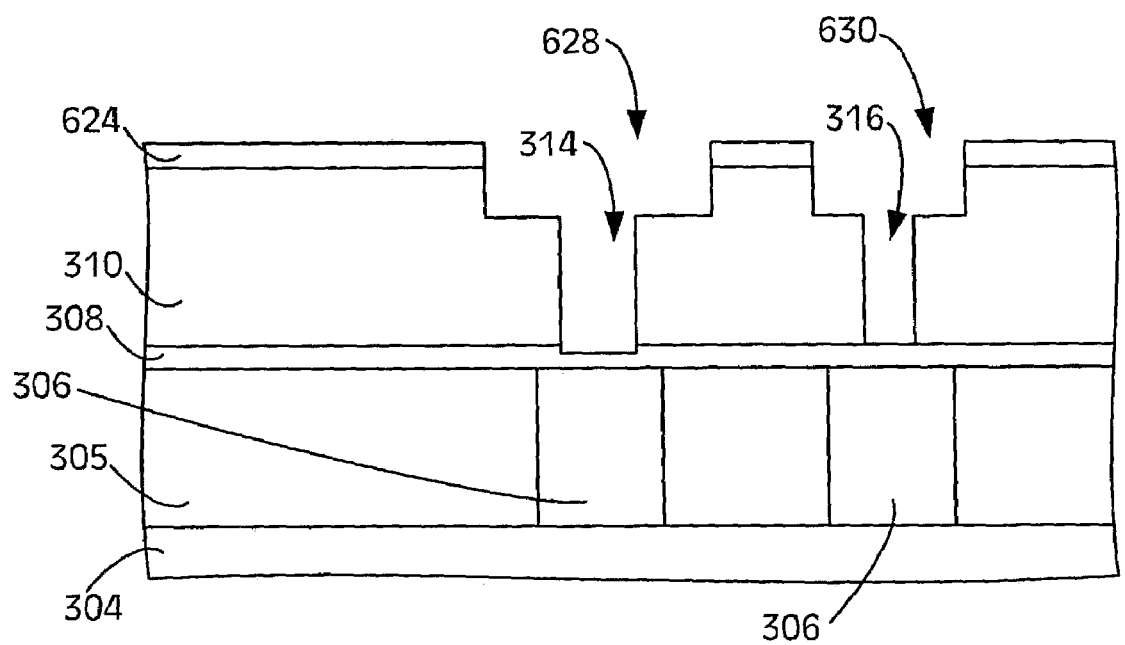
FIG. 6 is a schematic cut away view of a substrate after trenches have been etched.

Additional features are then formed (step 224). In this embodiment this may be done by first removing the via pattern photoresist mask 312, and providing a trench pattern photoresist mask 624 on the OSG layer 310, as shown in FIG. 6. The OSG layer 310 is then subjected to a trench etch. The trench etch may also use the etch chemistry and processing parameters, as described above regarding the OSG etch. As discussed above, using $C_4F_6$, $N_2$, and $CH_3F$ for the etch gas provides a fast OSG layer etch with a high selectivity to minimize the etching of the etch stop, and provides a relatively flat and non-tapered etch front for the trenches 628, 630, as shown in FIG. 6. This also helps to protect the photoresist layer 624. Since the etch stop 308 is not etched completely through, the metal contacts 306 are protected from corrosion and other damage by the etch stop layer 308.

Figure 7:
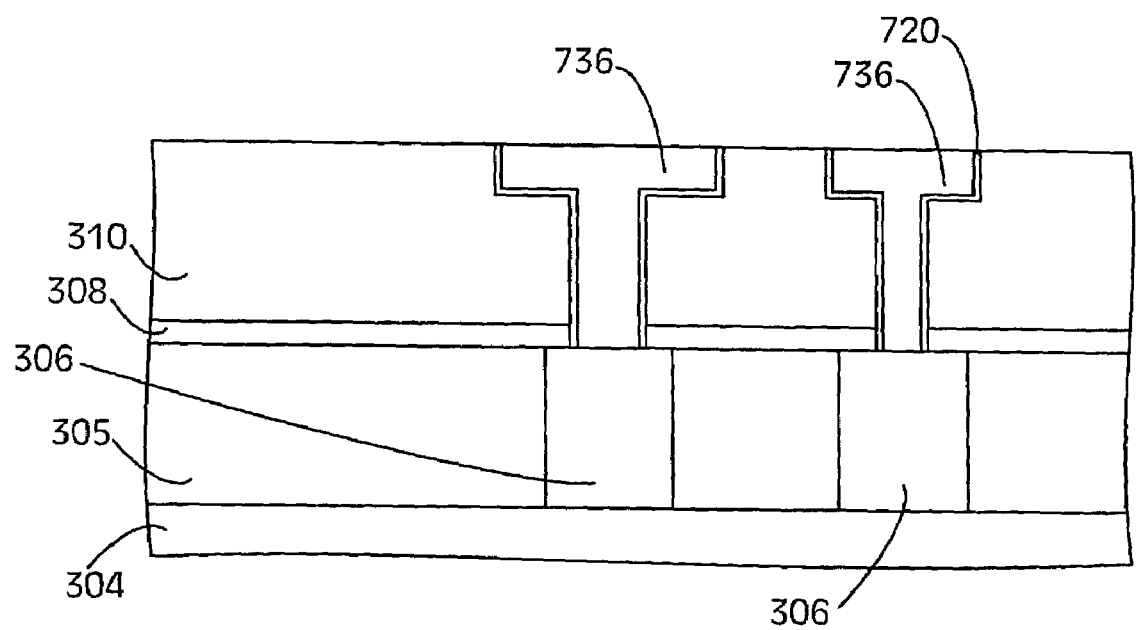
FIG. 7 is a schematic cut away view of a substrate after the features are completed

The trench pattern photoresist mask may then be stripped and etch stop may be opened (step 228), as shown in FIG. 7. The opening of the etch stop may be performed by using a process as follows, 150 mTorr, 50 sccm $CF_4$ and 200 sccm $N_2$ with 800 watts 27 MHz RF power.

Metal contacts may then be formed in the features (step 232). The formation of the metal contacts, may first form a barrier layer and/or a seed layer 720 in the features. The features may then be filled with metal. Chemical mechanical polishing CMP may be used to remove excess metal.

The process may be repeated to form additional OSG layers with metal features.

The resulting structure has small critical dimensions due to the use of a short wavelength photoresist and the thinness of the photoresist layer. The resulting structure has an effective low-k, due to the low-k value of the OSG, the low-k value of the etch stop and the thinness of the etch stop. In addition, corrosion and other contamination between metal contacts are reduced. The features are fully formed and preferably have relatively flat etch fronts. These properties are made possible by the etch chemistry and etch process.

Various embodiments may include other gas additives to the etch gas, such as argon and other inert gases. In other embodiments the OSG layer may use porous OSG with a k value of 2.2. A porous oxygen doped silicon carbide etch stop may have a k value of less than 4. More preferably a porous oxygen doped silicon carbide etch stop may have a k value of less than 3.7. In other embodiments the silicon carbide may be doped with other dopants such as nitrogen.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of forming features over a substrate, comprising:
    forming an oxygen-doped silicon carbide etch stop layer over the substrate;
    forming an organosilicate glass layer over the doped silicon carbide etch stop layer; and
    selectively etching a feature in the organosilicate glass layer with an organosilicate glass to oxygen-doped silicon carbide selectivity greater than 5:1, wherein the selective etching uses an etchant gas chemistry comprising $C_4F_6$ and a hydrogen containing species selected from the group of $CH_3F$, $CH_4$ and $H_2$.

2. The method, as recited in claim 1, further comprising forming a photoresist mask over the organosilicate glass before selectively etching the feature, wherein the photoresist mask is formed from a photoresist that is exposed by a radiation of a wavelength that is at most 193 nm.

3. The method, as recited in claim 1, wherein the oxygen-doped silicon carbide has an oxygen to silicon ratio that is greater than 1:2.

4. The method, as recited in claim 3, wherein the doped silicon carbide etch stop layer has a thickness of less than 50 nm.

5. The method, as recited in claim 4, further comprising:
    opening the doped silicon carbide etch stop layer at the feature; and
    filling the feature with metal.

6. The method, as recited in claim 1, wherein the organosilicate glass to doped silicon carbide selectivity greater than 15:1.

7. The method, as recited in claim 1, wherein the selective etching uses an etchant gas chemistry comprising $C_4F_6$ and $CH_3F$.

8. The method, as recited in claim 7, where the flow ratio between $C_4F_6$ and $CH_3F$ is between 2:1 and 1:2.

9. The method, as recited in claim 1, where the forming the oxygen-doped silicon carbide etch stop comprises providing a chemical vapor deposition layer of oxygen doped silicon carbide.

* * * * *